US006977852B2

(12) United States Patent
Naso et al.

(10) Patent No.: US 6,977,852 B2
(45) Date of Patent: Dec. 20, 2005

(54) ROM-BASED CONTROLLER MONITOR IN A MEMORY DEVICE

(75) Inventors: Giovanni Naso, Via Casilina Nord (IT); Pasquale Pistilli, Via Paolo (IT); Luca De Santis, Via Mazzarino (IT); Pasquale Conenna, Piazza Giulio Cesare (IT)

(73) Assignee: Micron Technology, Inc., Boise, ID (US)

( * ) Notice: Subject to any disclaimer, the term of this patent is extended or adjusted under 35 U.S.C. 154(b) by 153 days.

(21) Appl. No.: 10/696,973

(22) Filed: Oct. 30, 2003

(65) Prior Publication Data

US 2004/0213060 A1 Oct. 28, 2004

(30) Foreign Application Priority Data

Apr. 28, 2003 (IT) .......................... RM2003A0198

(51) Int. Cl.[7] .............................................. G11C 7/00
(52) U.S. Cl. .................................. 365/201; 365/189.02
(58) Field of Search ....................... 365/201 O, 189.02, 365/189.05

(56) References Cited

U.S. PATENT DOCUMENTS

| | | | |
|---|---|---|---|
| 5,592,613 A | * 1/1997 | Miyazawa et al. | ............. 714/6 |
| 5,892,776 A | 4/1999 | Kumakura | |
| 5,936,975 A | 8/1999 | Okamura | |
| 6,237,115 B1 | 5/2001 | Ting et al. | |
| 6,297,996 B1 | 10/2001 | McClure | |
| 6,324,626 B1 | * 11/2001 | Uenoyama et al. | ......... 711/163 |
| 6,556,480 B2 | * 4/2003 | Ravazzini | ............. 365/185.18 |
| 6,671,787 B2 | 12/2003 | Kanda et al. | |

* cited by examiner

*Primary Examiner*—VanThu Nguyen
(74) *Attorney, Agent, or Firm*—Leffert Jay & Polglaze, PA

(57) ABSTRACT

A circuit to monitor the activity of a memory device during program/erase operations that are managed by a ROM-based microcontroller. Different signals can be monitored according to different test modes. The ROM-based microcontroller is triggered by a clock that can be connected to an internal fixed frequency oscillator or to an external clock source for which the frequency can be varied from 0 Hz to any frequency required by the application. The circuit outputs state machine status data, read only memory addresses, and memory status information in a series of multiplexing operations to provide a tester with the ability to determine the state of a memory device during various memory operations.

13 Claims, 6 Drawing Sheets

ROM-BASED CONTROLLER MONITOR IN A MEMORY DEVICE

RELATED APPLICATION

This application claims priority to Italian Patent Application Ser. No. RM2003A000198, filed Apr. 28, 2003, entitled "ROM-BASED CONTROLLER MONITOR IN A MEMORY DEVICE," which is commonly assigned.

TECHNICAL FIELD OF THE INVENTION

The present invention relates generally to memory devices and in particular the present invention relates to testing and/or debugging flash memory devices.

BACKGROUND OF THE INVENTION

Flash memory devices have developed into a popular source of non-volatile memory for a wide range of electronic applications. Flash memory devices typically use a one-transistor memory cell that allows for high memory densities, high reliability, and low power consumption. Common uses for flash memory include portable computers, personal digital assistants (PDAs), digital cameras, and cellular telephones. Program code, system data such as a basic input/output system (BIOS), and other firmware can typically be stored in flash memory devices.

Flash memory operations such as erase and program are accomplished using complex algorithms composed of many different steps and requiring control over timing, counter, and analog voltages. For example, a word program operation is typically a loop of program pulses and program verifies until the desired value is written and verified with an appropriate voltage margin.

A circuit typically referred to as an algorithm controller is designed to manage the execution of the various complex steps of memory operations. The algorithm controller must track the steps of the operation even when one operation is suspended in order to service a higher priority operation. The algorithm controller must properly manage the interrupt and then resume the original operation at an appropriate point to allow the suspended operation to be correctly completed.

When a memory device is being developed, the code that makes up the various memory operations must be executed and debugged. However, it is very difficult to determine which step the algorithm controller is executing at any particular time. One method typically used is to read status bit information that the controller stores in control registers. These bits typically contain only general information about the algorithm being executed. No detailed information is provided about any specific step.

Another method for debugging is to perform internal probing using needles that touch internal points of the integrated circuit to detect interesting signal. However, the internal probing cannot detect more than a few signals at the same time and cannot be performed on integrated circuits that are encapsulated in a package.

For the reasons stated above, and for other reasons stated below which will become apparent to those skilled in the art upon reading and understanding the present specification, there is a need in the art for an alternative way to test and debug complex algorithms in memory devices.

SUMMARY

The above-mentioned problems with testing and debugging memory device algorithms and other problems are addressed by the present invention and will be understood by reading and studying the following specification.

The various embodiments relate to a circuit designed to monitor memory device operations, triggered by a clock, that are performed by a programmable controller. The circuit comprises a clock generation circuit that generates a selected clock signal. A microcontroller circuit is coupled to the selected clock signal. In one embodiment, the programmable controller has a read only memory that stores the instructions indicating the steps of the program and erase operations. The controller is coupled to a clock signal that executes the instructions of the program in one clock period. The memory device contains a test mode decoder that enables different test mode conditions. These conditions can be of various kinds such as to force analog/logic settings, to monitor analog values, or logic states transferring internal signals to the output pads.

A memory array that stores array data is coupled to the microcontroller circuit. An output circuit is coupled to the memory array and the microcontroller to multiplex between state machine data signals and the array data and outputting the results of the multiplexing.

Further embodiments of the invention include methods and apparatus of varying scope.

DETAILED DESCRIPTION

Figure 1:
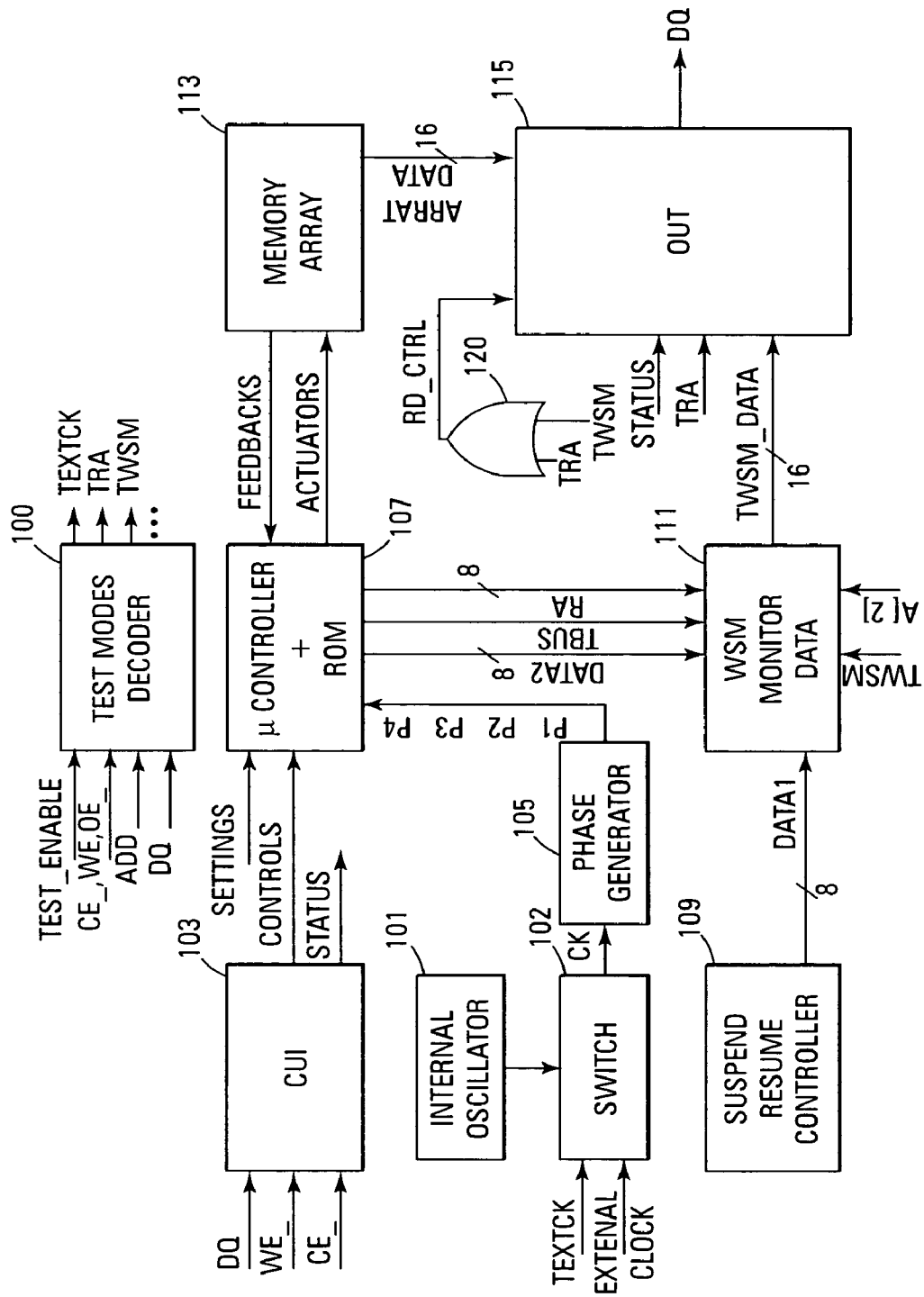
FIG. 1 shows a block diagram of one embodiment of the ROM-based controller monitor of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a block diagram of one embodiment of the monitor circuit of the present invention. The monitor circuit, used for test/debug purposes, tracks the activity of a flash memory performing program/erase operations organized by a ROM-based microcontroller.

Embodiments of the present invention can implement various test/debug modes such as a ROM address monitor mode, initiated by a "tra" signal, in which the ROM address (internal to the microcontroller) and the algorithm status registers (status) are made available at the output 115. Yet another mode is a Write State Machine Monitor mode, initiated by a "twsm" signal, that can provide the ROM address and other internal data related to the microcontroller 107 internal operations available at the output 115. For purposes of clarity, not all possible test/debug modes implemented by the present invention are illustrated here. The present invention is not limited to any one set of test/debug modes.

The test mode signals (e.g., "testck", "tra", and "twsm") are generated by a test mode decoder circuit 100 inside the memory device. In one embodiment, the decoder circuit 100 can be enabled only in a factory environment and not by the end user. This is accomplished by a "test enable" signal that cannot be forced by the customer. The test mode decoder circuit 100 is not generally available because the test modes are not available after bonding or because they require out of specification voltage values. After being enabled, the special test mode decoder 100 requires particular codes or addresses "ADD" and/or data ("DQ"), and particular values on control signals CE_, WE_, and OE_ to decode specific test modes according to well-known techniques in the art.

An internal oscillator 101 generates an internal clock signal that is used during normal operations of the memory device. The internal clock signal, in one embodiment, is a periodic signal having a fixed frequency.

An input for an external clock signal is provided to enable a special test/debug mode clock to be used for clocking the circuit. This input, which may be in the form of an electrical contact pad or other type of connection, can accept a clock signal having a frequency that can be varied by the tester. The clock may have a frequency in the range of 0 Hz to some predetermined maximum that varies with the application. For example, the clock signal can be run at a normal, periodic frequency during portions of the memory operations that are performing nominally. When the memory operation program code reaches a point that is suspect for having a problem, the clock can be slowed down or stopped at a particular point in order to monitor signals that correspond to a detected fail condition.

Both the internal clock signal and the external clock signal are input to a switching device 102 that switches between the two signals. The switching device may be some kind of transistor network that controls which clock signal is selected based on a switch control signal (i.e., "textck").

The switch control signal is generated by the special test mode decoder 100. The ROM-based microcontroller activity can be monitored either using the internal clock or an external clock, depending on the requirements of the particular issue to be debugged. Other embodiment use a switch control signal applied to an electrically conductive pad of the memory device.

The selected clock (i.e., "ck") output from the switching device 102 is input to a phase generator 105 that is responsible for generating multiple clock signals. In one embodiment, the phase generator 105 generates four separate clock signals that are output on four separate clock signal lines to the microcontroller 107. Each of the four clock signals has a phase difference from the other three clock signals. One embodiment of such clock signals is illustrated in the timing diagram of FIG. 3 and discussed subsequently. These four phase-separated clock signals are labeled as p1–p4 in FIG. 1.

The ROM-based microcontroller 107 is synchronized to the various clock phases p1–p4. In one embodiment, specific steps of program/erase operations executed by the microcontroller 107 are synchronized to different phases of the clock.

A Command User Interface (CUI) 103 generates control signals and status signals from control and data signals that are input to the CUI 103. The CUI 103 determines the desired mode to be initiated. In one embodiment, the integrated circuit chip enable signal (i.e., CE_), the integrated circuit write enable signal (i.e., WE_), and a subset of the DQ lines are input to the Command User Interface 103. Alternate embodiments use other control signal inputs and different quantities of the DQ lines.

The CUI 103 is an asynchronous decoder having an internal ROM and decoder logic to decode input DQ lines in order to generate control signals to the microcontroller 107. The state of the CE_ and CE_ signals determine when the DQ lines are decoded. In one embodiment, the CE_ is in a false state (e.g., a logical high) and the CE_ signal is in a true state (e.g., a logical low) to initiate the decode operation of the DQ lines. The CUI 103 can be programmed to decode the DQ lines into any control signals dependent on the application. CUI's 103 are well known in the art and are not discussed further.

The control signals generated by the CUI 103 are input to the microcontroller 107. The status signals generated by the CUI 103 are input to an output block 115. The control signals from the CUI 103 are used by the microcontroller 107 to initiate the program/erase algorithm. The status signals are input to the Output block 115 to be multiplexed to the DQ output as discussed subsequently with reference to FIG. 5. These status signals may include the status of the initiated memory operations such as erase, program, and read. Other embodiments use other status signals.

In one embodiment, if the CE_ signal is true and the WE_ signal is false and a predetermined pattern representing program or erase initiation code is present on the subset of DQ lines, a complex sequence of operations needed to perform a location program or a sector erase is initiated. The routines to perform program/erase operations are adaptive algorithms that depend on feedback signals (e.g., cell threshold voltages) received from the memory array 113 and from user interrupts. For example, if the ROM instructions specify a program memory operation along with a verify operation, the microcontroller 107 would check the memory cells' threshold voltages to determine if they have reached the target voltage for a programmed state. If the programmed state has not been reached, the microcontroller continues to execute program instructions that send program pulses to the array.

The microcontroller 107 has a setting signal input that, in one embodiment, specifies the parameters to be used in program or erase operations. These setting signals are, in one embodiment, stored in flash memory cells dedicated to performing algorithm trimming/adjustments. These special flash memory cells are programmed/erased in the factory using specific test modes. For example, one such setting may specify the number of program-verify operations performed before a cell is considered to have failed. Other embodiments specify additional parameters for the setting signals.

Since an operation of a flash memory device can be interrupted by another operation, some means should be provided to track and control these interruptions. A Suspend Resume Controller 109 performs this task by queuing a suspend request, interrupting the microcontroller 107 at the appropriate time while signaling this event to the device status register, and resuming execution of the interrupted operation when a resume command is received. The Suspend Resume Controller generates data signals (i.e., "data1") related to the suspend and resume operations. For example, typical signals from the Suspend Resume Controller 109 could be: suspend request, suspend completed, reset of suspension operation, and algorithm completed. Alternate embodiments use different and/or additional signals.

The WSM monitor 111 monitors multiple input signals in order to generate test mode write state machine monitor data signals. These signals are output from the WSM monitor 111 as a 16-bit "twsm_data" signal. In one embodiment, the WSM monitor 111 is coupled to the data lines (i.e., "data1") from a Suspend Resume controller 109, a subset of the address lines (i.e., a[2]) of the memory device, an 8-bit ROM row address (i.e., "ra") from the microcontroller 107, a test bus control signal (i.e., "tbus") from the microcontroller 107, microcontroller 107 status signals (i.e., "data2"), and a test mode write state machine monitor signal (i.e., "twsm"). The microcontroller signals are discussed subsequently in more detail with reference to FIG. 2. The twsm_data signals output from the WSM monitor 111 are input to the Output block 115 as described below with reference to FIG. 5.

The Output block 115 is an output device that includes means for monitoring data signals, address signal, and/or test/debug signals from the memory array 113 and the ROM internal to the microcontroller 107. The Output block 115 also includes multiplexers, controlled by a "rd_ctrl" signal and other signals as described subsequently, to select between the data output from the memory array 113 and "twsm_data" from the WSM monitor 111. The "rd_ctrl" signal is generated by logically ORing 120 the "tra" signal (i.e., ROM address monitor mode initiation signal) with the "twsm" signal (i.e., Write State Machine monitor mode initiation signal). If either of these signals are true, the output of the OR operation 120 is true.

In one embodiment, when the "rd_ctrl" signal is a logical one, the monitor data is selected. A logical zero on the "rd_ctrl" signal selects the memory array data. Alternate embodiments use the inverse of these logic levels to select between the output block 115 inputs. The use of the "rd_ctrl" signal is described in greater detail with reference to FIG. 5.

Figure 2:
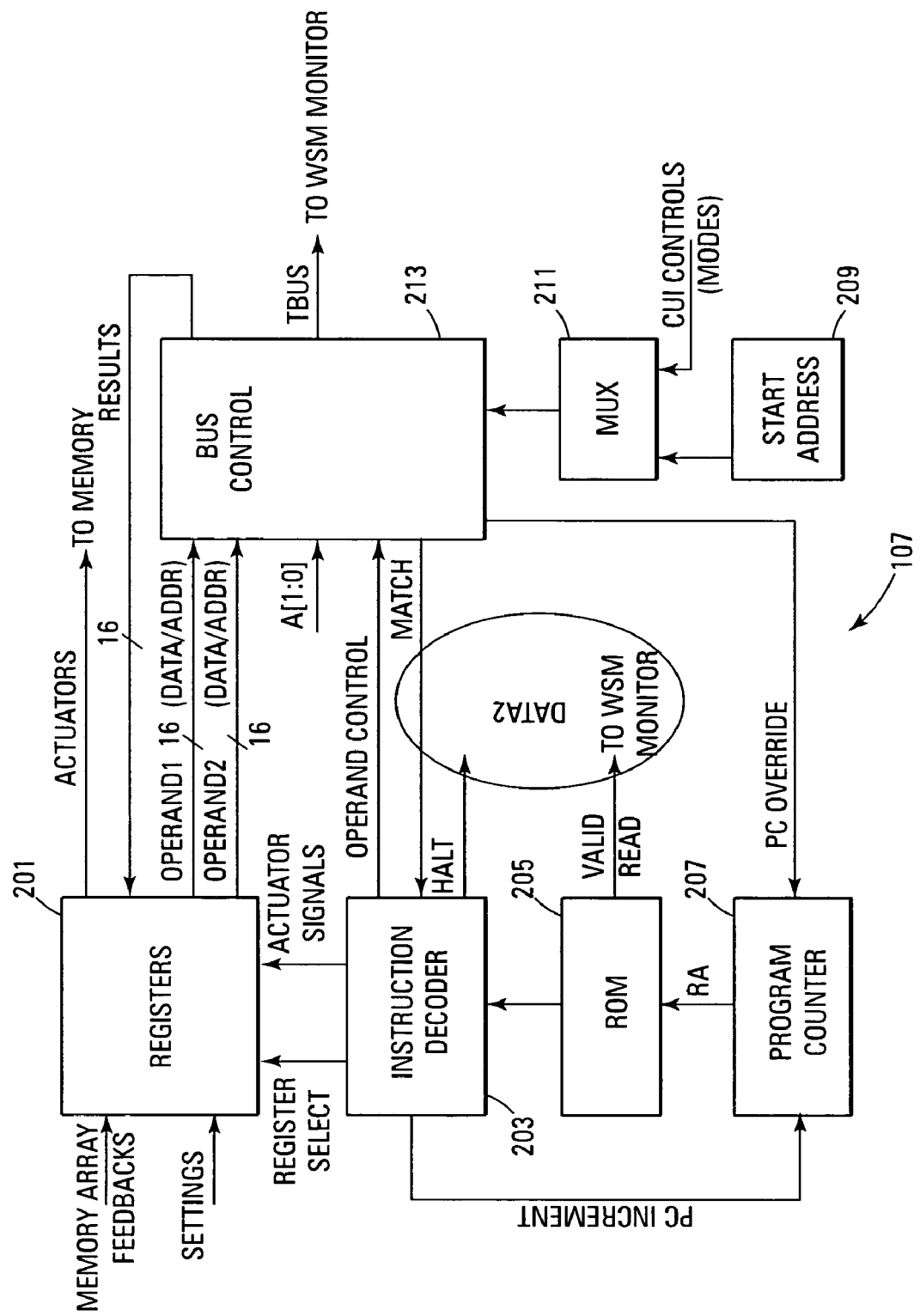
FIG. 2 shows a block diagram of one embodiment of the ROM-based programmable microcontroller of the present invention.

FIG. 2 illustrates a block diagram of one embodiment of the ROM-based microcontroller 107 of the present invention. The microcontroller 107 is comprised of an instruction decoder 203 that reads and executes instructions that are stored in the ROM 205. The instruction decoder 203 can also perform other types of actions such as increment the program counter to go to subsequent instructions in the ROM 205, perform operations on data (operands) in bus control circuitry 213, select a register 201 to store actuator signals that are used to initiate memory operations (e.g., erase, program) as described previously, and generate control signals to properly manage different steps of program/erase operations. Some of these control signals (e.g., halt) are also sent to the WSM monitor 111 of FIG. 1 to be eventually monitored during debug operations.

The register 201 stores data such as the feedback signals from the memory array, the settings for the microcontroller 107 parameters, and the actuator signals used by the memory array. This data is stored in select register locations as selected by the instruction decoder 203 using the register select input signal.

The register 201 additionally stores the data used as operands by the bus control circuitry 213. The bus control circuitry 213 uses the operands and other input signals to generate control signals for bus control internal to the memory device. These control signals include the "results" signals that are stored in the register 201 of the microcontroller. Part of these control signals are grouped in the "tbus" signals that are sent to the WSM monitor of FIG. 1 for debug purposes. The operations of the bus control circuitry 213 and the internal bus control signals generated therefrom are well known in the flash memory art and are not discussed further here.

A program counter 207 can be forced to a predetermined program count in response to control signals from the CUI of FIG. 1. A memory 209 or data latch stores one or more ROM addresses for each mode of which the ROM-based microcontroller 107 of the present invention is capable. The instructions required for the particular mode are stored in the ROM 205 starting at that address. The appropriate address is chosen by the CUI control signals selecting the particular address through a multiplexer 211.

The state of the CUI control signals determines which ROM address is selected. For example, as seen in FIG. 1, if the WE_ signal is false and the CE_ signal is true the data present on the subset of the DQ lines determines the operation to be initiated: a program or erase.

The CUI control signals then select the desired operation by selecting that particular operation's ROM address through the multiplexer 211 control inputs. This address is input to the bus control circuitry 213 that determines when, in response to one or more clock phases, to input this value (e.g., pc override) to the program counter 207 as the new ROM address signal.

The jump to the new ROM address may be unconditional or conditional. In an unconditional jump, the program counter 207 is loaded with the new ROM address and the instruction decoder 203 starts executing from that address automatically. In a conditional jump, the bus control circuitry 213 determines if the conditions, coming from operand1/operand2, are satisfied to perform a requested jump. Usually these conditions are related to analog/logic checks that need to be satisfied after a group of steps of an algorithm in order to perform a new group of steps.

The instruction decoder 203 and the ROM 205, under control of the program counter 207, generate the control signals designated as "data2" in FIG. 1. These control signals may include a halt command, a valid data command, and a read command. These commands and their use are well known in the art and are not discussed further in this document. Alternate embodiments use other commands in addition to or in place of these commands.

FIG. 2 illustrates only one possible implementation of the ROM-based microcontroller of the present invention. The present invention is not limited to any one microcontroller architecture.

Figure 3:
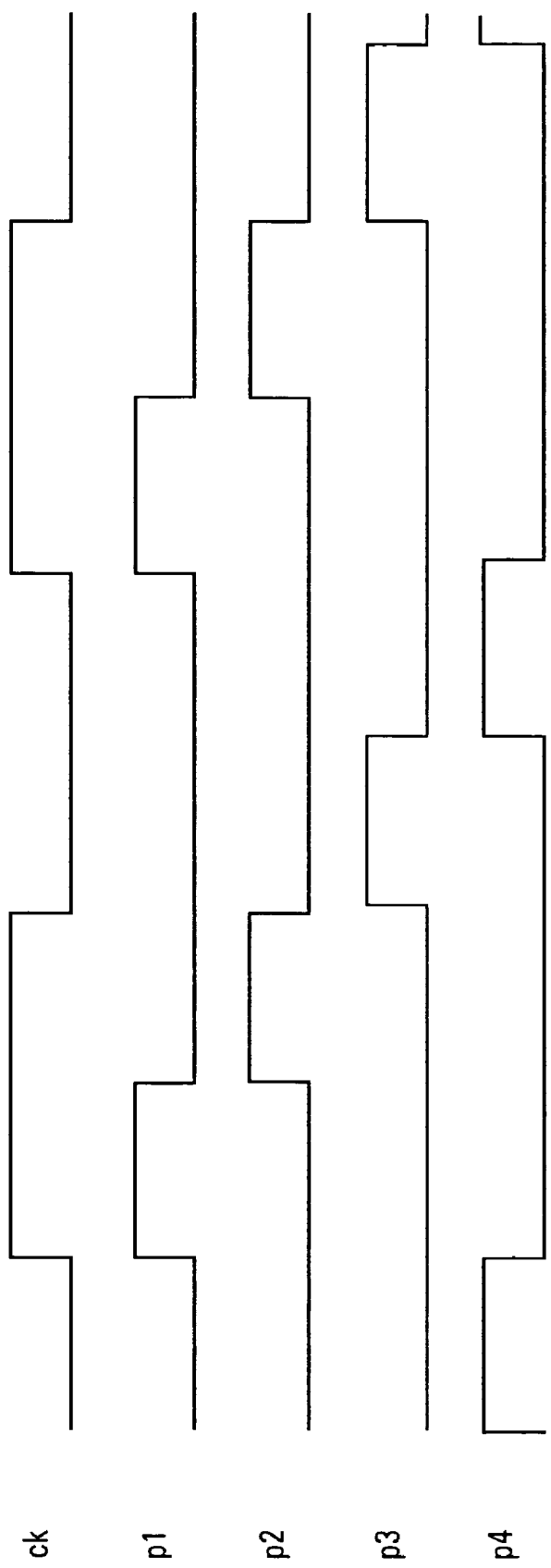
FIG. 3 shows a timing diagram of one embodiment of the clocking signals of the present invention.

FIG. 3 illustrates a timing diagram of one embodiment of the ROM-based microcontroller of the present invention. The clock selected from either the internal or external clock is designated as "ck". The four phases that are generated from the phase generator of FIG. 1 are illustrated as p1–p4. In this embodiment, the different phases have the same frequency as the selected clock but are offset in time.

The frequency of the selected clock is dependent on the application and, therefore, is not illustrated in this embodiment. Alternate embodiments may use different time offsets and different frequencies.

Figure 4:
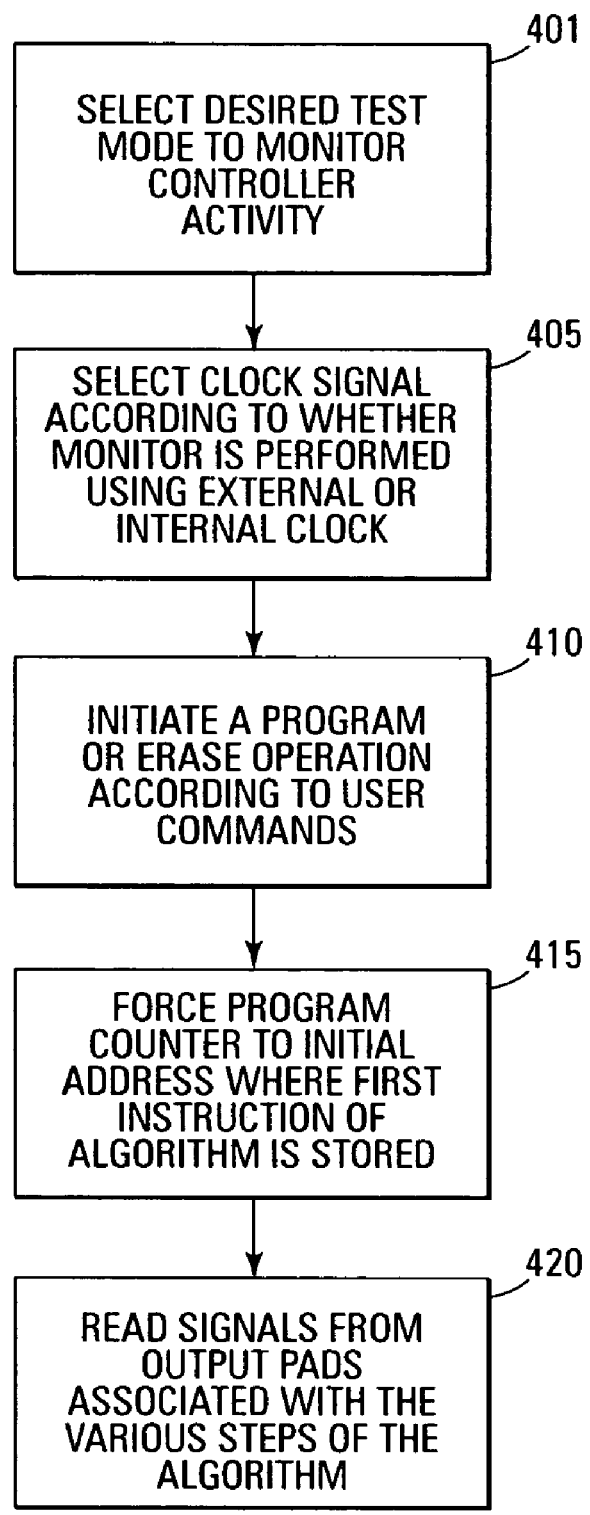
FIG. 4 shows a flowchart of one embodiment of a method to monitor the activity of a memory performing program/erase operations of the present invention.

FIG. 4 illustrates a flowchart of one embodiment of a method to monitor the activity of a memory performing program/erase operations of the present invention. The desired monitor test mode is initiated 401 by a test mode decoder of FIG. 1 as discussed previously. The appropriate clock is selected 405 in response to different debug needs.

The operation to be debugged (either program or erase) is started 410 by user mode commands. The starting ROM address associated to the requested operation is automatically loaded 415 into the program counter to enable the instruction decoder to execute instructions from the ROM beginning at this address. The accessed ROM locations may include actuator signals for use by the microcontroller to perform cell erase or program operations on the memory array. Some of the actuator signals may be generated in response to feedback signals from the memory array.

Figure 5:
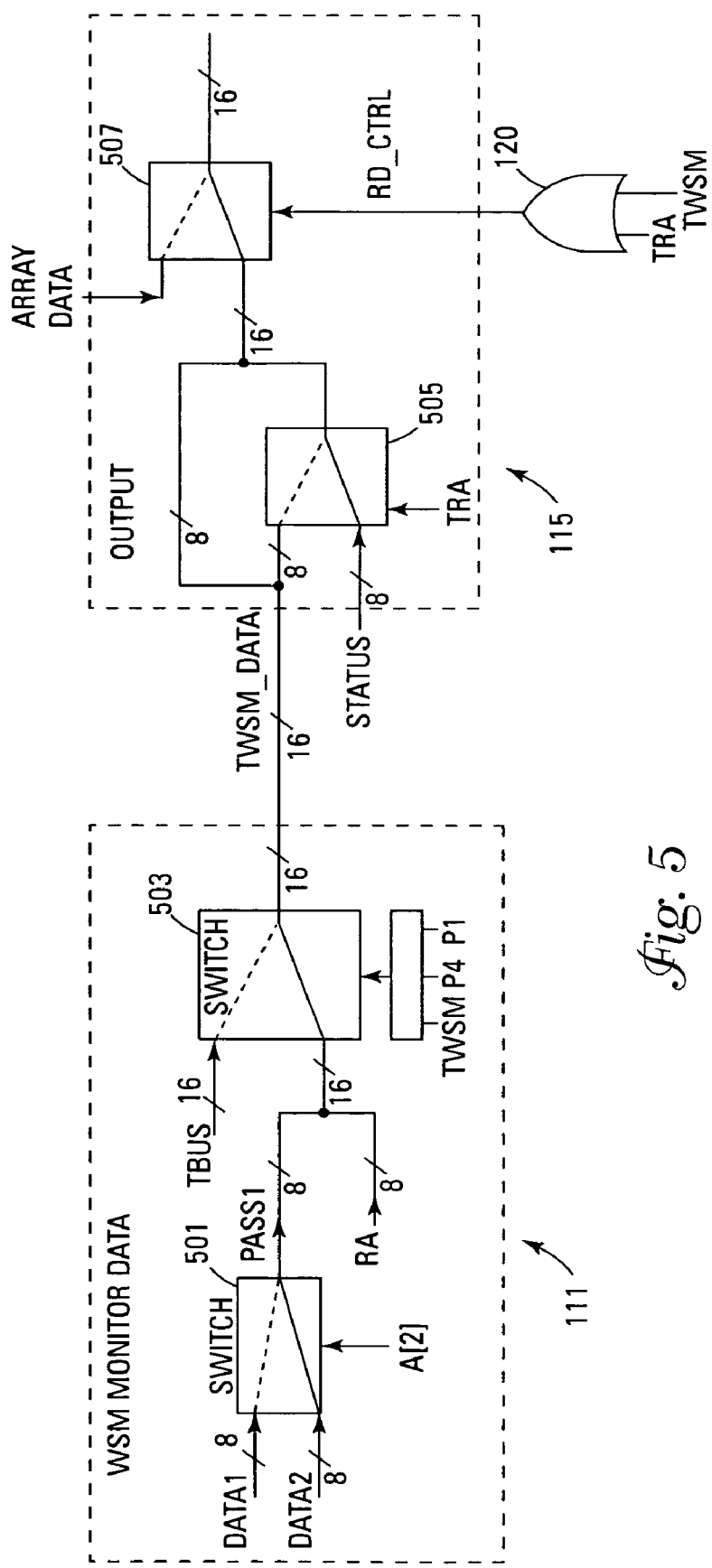
FIG. 5 shows a block diagram of one embodiment of the WSM Monitor Data and Output blocks in accordance with FIG. 1.

FIG. 5 illustrates one embodiment of a more detailed block diagram of the WSM Monitor Data block 111 and Output block 115 of FIG. 1. The WSM Monitor Data block 111 has a multiplexer 501 that switches between the "data1" signal from the suspend resume controller of FIG. 1 and the "data2" signal from the microcontroller. The multiplexer control signal, in this embodiment, is the second address line (i.e., a[2]). As is well known in the art, when a[2] is a logical high, one input of the multiplexer 501 is chosen. When a[2] is a logical low, the other input of the multiplexer 501 is chosen. Alternate embodiments use other control signals. The output from this multiplexer 501 is an 8-bit signal (either "data1" or "data2") that is combined with the ROM address "ra" signal to form a 16-bit signal that is input to a second multiplexer 503.

The second multiplexer 503 also has the "tbus" signal from the microcontroller as a second input. The control signal of this multiplexer 503 is the "twsm" signal and the clock phases p1 and p4. If "twsm" is in a logical low state, "twsm_data" is the concatenation of the "ra" and "pass1" signals. An example of such a signal can be expressed as twsm_data[15:0]=(ra[15:8], pass1[7:0]). Alternate embodiments may concatenate these signals in other ways.

If the "twsm" signal is a logical high state, "twsm_data" is "tbus" during p1 and p4. During p2 and p3, "twsm_data" is a concatenation of "ra" and "pass1" as expressed above.

The Output block 115 is comprised of two multiplexers 505 and 507 that multiplex among the "twsm_data" signal, the "status" signal and the "array data" from the memory array. The first multiplexer 505 switches between one byte of "twsm_data" and the "status" signals. In one embodiment, the most significant byte of "twsm_data" is split from the input signal and input to the second multiplexer 507 of the Output block 115. Alternate embodiments user different portions of "twsm_data".

The "tra" signal controls the switching of the first multiplexer 505. In one embodiment, if "tra" is a logical high, the "status" signals are chosen. If "tra" is a logical low, the least significant byte of "twsm_data" is chosen as the output of the multiplexer 505. Alternate embodiments use inverse logic states for "tra".

The output of the first multiplexer 505 is concatenated with the most significant byte of "twsm_data" and is input to the second multiplexer 507. If "tra" is a logical high, this input is the most significant byte of "twsm_data" concatenated with the "status" signals. If "tra" is a logical low, this input is "twsm_data".

The second input to the second multiplexer is the array data from the memory array. In one embodiment, this is a 16-bit word. The "rd_ctrl" signal from the OR operation 120 selects between the two inputs. When "tra" and "twsm" are both in a logical low state (i.e., OR output is low), the array data is chosen as the DQ output. If "tra" is a logic high and "twsm" is a logic low, DQ is the concatenation of the most significant byte of "twsm_data" and "status". If "tra" is a logic low and "twsm" is a logic high, DQ is the same as "twsm_data".

Figure 6:
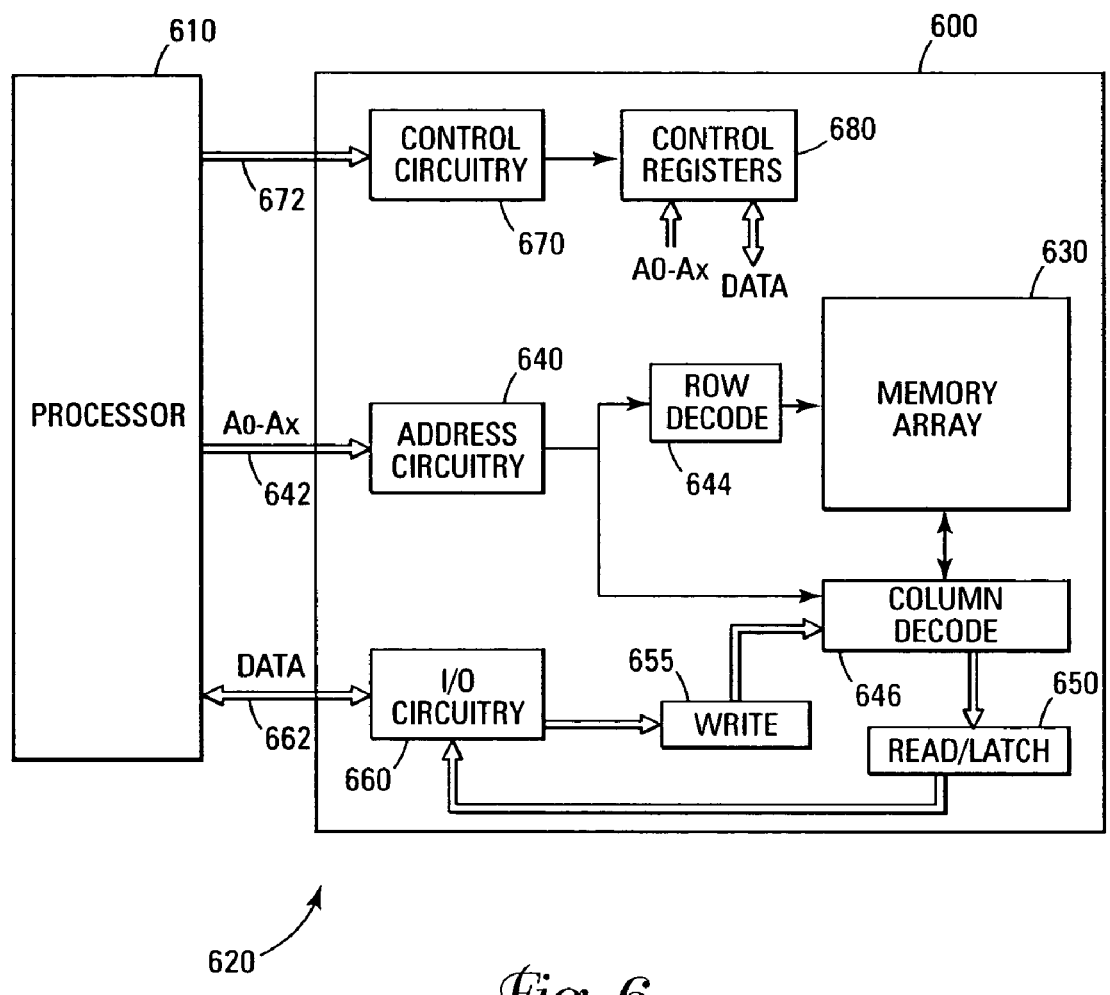
FIG. 6 shows a block diagram of one embodiment of a memory device of the present invention.

FIG. 6 illustrates a functional block diagram of one embodiment of a memory device 600 of the present invention. The memory device 600 may be coupled to a processor 610 to form part of an electronic system 620. The memory device 600 has been simplified to focus on features of the memory that are helpful in understanding the present invention. In one embodiment, the memory device is a flash memory device.

The memory device includes an array of memory cells 630. The memory cells are non-volatile floating-gate memory cells and the memory array 630 is arranged in banks of rows and columns. In one embodiment, the array of memory cells is comprised of a block of memory that makes up a predetermined address range in the memory array.

An address buffer circuit 640 is provided to latch address signals provided on address input connections A0–Ax 642. Address signals are received and decoded by a row decoder 644 and a column decoder 646 to access the memory array 630. It will be appreciated by those skilled in the art, with the benefit of the present description, that the number of address input connections depends on the density and architecture of the memory array 630. That is, the number of addresses increases with both increased memory cell counts and increased bank and block counts.

The memory device 600 reads data in the memory array 630 using sense amplifiers to sense voltage or current changes in the memory array columns using read/latch circuitry 650. The read/latch circuitry 650, in one embodiment, is coupled to read and latch a row of data from the memory array 630. Data input and output buffer circuitry 660 is included for bi-directional data communication over a plurality of data connections (DQ) 662 with the processor 610. Write circuitry 655 is provided to write data to the memory array.

Command control circuit 670 decodes signals provided on control connections 672 from the processor 610. These signals are used to control the operations on the memory array 630, including data read, data write, and erase operations. In one embodiment, the control circuitry 670 is comprised of a state machine that executes the control functions of the memory device 600 and generates the enable word signals of the present invention.

An array of control registers 680 stores the commands and the control data. Some of the control registers are used for typical control functions and others may be reserved for expansion and/or future use.

The memory device illustrated in FIG. 6 has been simplified to facilitate a basic understanding of the features of the memory as they relate to the present invention. A more detailed understanding of internal circuitry and functions of flash memories and synchronous flash memories are known to those skilled in the art. Alternate embodiments of the memory device of FIG. 6 include other types of memory such as synchronous flash memory, NAND architecture flash memory, NOR architecture flash memory, and other types of non-volatile memory.

CONCLUSION

The ROM-based microcontroller circuit of the present invention can be monitored as an external clocking signal steps through different test/debug methods. A predetermined mode initiation code can be input to the circuit in order to set the circuit in the desired test/debug mode and eventually switch from an internal clock signal to the external clock signal. Various control signals can then be used to choose whether the output of the circuit is data from the memory array or control/status signals for debugging the requested program/erase operation.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A controller monitor circuit in a memory device, the circuit comprising:
    a program memory that stores a program/erase routine;
    a microcontroller circuit coupled to a selected clock signal and the program memory, the microcontroller circuit generating state machine data signals in response to the selected clock signal and the program/erase routine;
    a memory array, coupled to the microcontroller circuit, for storing array data; and
    an output circuit coupled to the memory array and the microcontroller for multiplexing between state machine data signals and the array data in response to the program/erase routine.

2. The circuit of claim 1 and further including a test mode decoder circuit that selects controller monitor circuit configurations and generates test mode signals.

3. The circuit of claim 2 wherein the test mode decoder circuit operates in response to address and memory device control signal inputs.

4. The circuit of claim 1 and further including a clock generation circuit that selects between an internal clock signal and an external clock signal to generate the selected clock signal.

5. The circuit of claim 4 and further including an internal clock oscillator that generates the internal clock signal.

6. The circuit of claim 1 wherein the selected clock signal comprises a plurality of clock phases.

7. The circuit of claim 1 wherein the selected clock signal has a frequency that is variable down to 0 Hz.

8. The circuit of claim 1 and further including a program/erase initiation circuit, coupled to the microcontroller, that generates control signals to initiate program or erase operations.

9. The circuit of claim 8 wherein the microcontroller includes a program counter that is adapted to be loaded with a program memory start address indicating a location in the program memory that stores an initial address of the program/erase routine.

10. A controller monitor circuit in a memory device, the circuit comprising:
    a clock signal switching circuit for switching between an external clock signal and an internal clock signal to generate a selected clock signal;
    a phase generation circuit for generating a plurality of clock phases from the selected clock signal;
    a microcontroller circuit coupled to the plurality of clock phases, the microcontroller circuit generating state machine data signals and having a read only memory that stores program/erase routines at a predetermined address;
    a flash memory array, coupled to the microcontroller circuit, for storing array data; and
    an output circuit for multiplexing between at least the state machine data signals and the array data and outputting results of the multiplexing.

11. The circuit of claim 10 and further including a test mode decoder circuit coupled to the microcontroller circuit and the output circuit, the test mode decoder circuit generating test signals to set-up the controller monitor circuit and enable the output circuit to multiplex between the status signals, the state machine data signals, and the array data.

12. The circuit of claim 10 wherein the state machine data includes a read only memory address and a status of the microcontroller circuit.

13. The circuit of claim 10 wherein the microcontroller circuit comprises:
    a program counter, coupled to the read only memory, for generating read only memory addresses;
    an instruction decoder, coupled to the read only memory and the program counter, for accessing and interpreting the instructions from the read only memory in response to the program counter and incrementing the program counter;
    a register circuit, coupled to the instruction decoder, for storing data generated from the instruction decoder and feedback signals from the flash memory array that indicate status of a memory operation; and
    a start address memory, coupled to the program counter, for storing read only memory addresses indicating a location for the program/erase routines.

* * * * *